US006165698A

United States Patent [19]

Kawamura et al.

[11] Patent Number: 6,165,698

[45] Date of Patent: Dec. 26, 2000

[54] METHOD FOR FORMING IMAGE HAVING PROTECTIVE LAYER THEREON

[75] Inventors: Tomonori Kawamura; Kiyoshi Hagiwara; Yasunobu Kobayashi, all of Hino, Japan

[73] Assignee: Konica Corporation, Tokyo, Japan

[21] Appl. No.: 09/160,783

[22] Filed: Sep. 24, 1998

[30] Foreign Application Priority Data

| | | | |
|---|---|---|---|
| Sep. 29, 1997 | [JP] | Japan | 9-263827 |
| Feb. 19, 1998 | [JP] | Japan | 10-037209 |

[51] Int. Cl.$^{7}$ .......... G03F 7/00

[52] U.S. Cl. .......... 430/331; 430/33; 430/257; 430/961

[58] Field of Search .......... 430/331, 257, 430/33, 961

[56] References Cited

U.S. PATENT DOCUMENTS

| | | | |
|---|---|---|---|
| 5,094,931 | 3/1992 | Platzer | 430/143 |
| 5,494,885 | 2/1996 | Kudo | 503/227 |
| 5,935,759 | 8/1999 | Mertes | 430/257 |
| 6,060,211 | 5/2000 | Sugitani | 430/262 |

*Primary Examiner*—Mark F. Huff
*Assistant Examiner*—Nicole Barreca
*Attorney, Agent, or Firm*—Frishauf, Holtz, Goodman, Langer & Chick, P.C.

[57] ABSTRACT

A method for forming an image having a protective layer is disclosed. The method comprises the steps of forming an image comprising a support having thereon an image comprising a layer comprising a binder and a colorant having a thickness of $t_1$, providing a protective layer on the surface of the image by transferring a thermally transferable layer from a transferring foil comprising a support having thereon the thermally transferable layer having a thickness of $t_2$ which is formed by coating and drying a coating liquid, which comprises a thermoplastic resin emulsion dispersed in a dispersing medium, on the support, wherein the $t_1$ and $t_2$ satisfy a relation of $t_2 > 2 \times t_1$.

11 Claims, No Drawings

METHOD FOR FORMING IMAGE HAVING PROTECTIVE LAYER THEREON

FIELD OF THE INVENTION

This invention relates to a method for forming an image having a protective layer thereon using a protective layer transferring foil to give a high durability to the image formed on an image forming element.

BACKGROUND OF THE INVENTION

A diffusion type thermal transfer image forming method, an image forming method using electronic photography and an image forming method, so-called an ablation method, have been known. In the ablation image forming method, a recording element having a colorant layer is imagewise irradiated by condensed energy of light such as laser light to deform by diffusion, or remove by scattering, burning or evaporating a part of the colorant layer to form an image. Thus formed image is formed an unevenness on the surface of the recorded sheet since the image is formed by imagewise transferring or remaining of a layer of an ink or toner on a recording sheet. As a result of that, the image is easily damaged when the image is scratched by a nail or a sharp metal piece.

A method using a laminating element of a transferring foil has been known to protect such the image. In the case of the laminate element composed of a support and a heat-sensitive or pressure-sensitive resin layer, which is become adhesive by heat or pressure, the resin layer is laminated on the image surface together with the support, and in the case of the transferring foil, only the resin layer is transferred on the image surface and the support of the foil is peeled off after transferring.

However, formation a image protective layer having a sufficient durability and quality becomes to be difficult accompanied with raising in the precision of the image since the adhesion of the protective rain layer is difficultly adhered to the surface of the colorant layer and to the concave portion of the image. Furthermore, usually used laminating element and the transferring foil are insufficient in the slipping ability in an image forming apparatus and tend to be frequently jammed.

SUMMARY OF THE INVENTION

The object of the invention is to provide a method for easily forming an image having a high durability without jamming in the image forming apparatus.

The object of the invention can be attained by a method for providing a protective layer in an image comprising the steps of forming an image comprising a support having thereon an image comprising a layer comprising a binder and a colorant having a thickness of $t_1$, providing a protective layer on the surface of the image by transferring a layer capable of thermally transferring from a transferring foil comprising a support having thereon the layer capable of thermally transferring and having a thickness of $t_2$ which is formed by coating and drying a coating liquid containing a thermoplastic resin emulsion dispersed in a solvent on the support, wherein the $t_1$ and $t_2$ satisfy a relation of $t_2$>233 $t_1$.

DETAILED DESCRIPTION OF THE INVENTION

The transferring foil, image forming element, image peeling sheet and the image forming procedure according to the invention are described below.

Protective Layer Transferring Foil

The protective layer transferring foil to be used in the invention has a thermally transferable layer on a support. The thermally transferable layer is faced and contacted by heating and pressing to an element on the surface of which a colorant layer is imagewise exist forming an uneven surface. Then the support supporting the heat sensitive layer is peeled off so the heat sensitive layer is transferred on the image surface to protect the image.

As the support of the transferring foil, a resin film such as a film of a polyacrylic ester, a polymethacrylic ester, a polyethylene terephthalate, a polyethylene naphthalate, a polycarbonate, a polyallylate, a polyvinyl chloride, a polyethylene, a polypropylene, a polystyrene, a nylon, an aromatic polyamide, a polyether ether ketone, a polysulfone, polyimide and a polyetherimide, are useful. A film composed of laminated two or more layers of the above mentioned resin. The thickness of the support is preferably from 5 $\mu$m to 100 $\mu$m, more preferably from 10 $\mu$m to 50 $\mu$m.

The glossiness of the support may be made a specified value to control the surface glossiness of the heat-sensitive transferring layer after the transfer so as to have a high quality matted surface. A suitable matted surface of the transferred layer surface can be obtained when the glossiness of the support surface is 90 or lees in the glossiness measured at 60°. When the surface of the transferred layer is matted, the obverse and the reverse of the image forming element can be easily distinguished according to the difference of the matted degree. In the case of a transparent image, the transparency tends to become too low when the glossiness is lower than 40.

The thermally transferable layer of the protective layer transferring foil is formed by coating a resin emulsion of the support. In the invention, the resin emulsion is an emulsion liquid in which particles of resin which is not dissolved in the medium and have a certain particle diameter distribution, are dispersed optionally together with a surfactant according to necessity.

In the invention, the thermoplastic resin is added in a form of emulsion into the coating liquid of the thermally transferable layer. As a result of that, the thermoplastic resin is exited in an ununiform state in the thermally transferable layer, and the adhesiveness of the thermally transferable layer is enhanced.

As the resin to be used in the emulsion, a thermoplastic resin such as the followings are useful: a polyester resin, a urethane resin, a styrene-rubber copolymer resin such as styrene-butadiene copolymer and a styrene-isoprene copolymer, an polyacryl resin, a polyvinyl acetate resin, an polyethylene resin such as ethylene-vinyl acetate copolymer and ethylene-ethyl acrylate copolymer, a polyvinyl acetal resin such as polyvinyl butyral, and a vinyl chloride resin such as a vinyl chloride-vinyl acetate copolymer. Among them, a polyester resin is preferred from the viewpoint of the adhesiveness and the durability.

It is preferred that the foregoing thermoplastic resins each has a glass transition point Tg of from 20° to 70° C., and the content of such the resin is not less than 50% of the whole solid content of the dispersion. By satisfying such the conditions, the jamming is reduced and adhesiveness with the image forming layer is raised.

A solvent or a mixture of solvents each having a low dissolving ability to the resin is preferably used as a medium for maintaining the resin particles in the form of emulsion in the medium.

Water and an alcohol such as methanol, ethanol, a branched or linear propanol and butanol are preferably used as the dispersing medium of the resin dispersion. Another organic solvent may be mixed with the medium unless the dispersibility is not degraded.

A lubricant such as silicone compound, a wax, a solid molybdenum compound and Teflon powder is preferably added to raise the durability of the heat-transferring layer after the transfer. The adding amount of the lubricant is preferably from 0.1% to 50%, more preferably 1% to 10% by weight of the resin.

It is preferred to add a fine particle to the heat-transferring layer of the protective layer transferring foil to control the glossiness of the heat-transferring layer after the transfer. A fine particle of an organic compound such as a melamine resin and a polymethyl methacrylate resin, and a that of an inorganic compound such as titanium oxide, zinc oxide, calcium carbonate, aluminum oxide, kaolin, clay, silica, talc and mica, are usable as such the fine particle, and one having a higher oil absorbability, specific surface area and specific volume gravity is particularly preferred. When the support of the protective layer transferring foil has a high smoothness, a suitable matted surface can be obtained by controlling the adding amount of the fine particle. The adding amount of the fine particle is usually from 0.1% to 40%, preferably from 1% to 30% by weight.

Both of the transparency and the matte degree of the image after transfer of the transferring layer can be satisfied by adjusting the glossiness of the surface of the protective layer transferring foil before the transfer from 40 to 90 measured at 60°. Moreover, formation of a bubble and wrinkle at the time of transfer the layer onto the image forming element can be reduced considerably by addition of the fine particle.

The image forming element on which an image has been formed and the protective layer transferring foil are faced to each other and subjected to pressing or heating-pressing to transfer the thermally transferable layer of the foil only onto the image forming element to form an image protective layer.

Any device capable of giving pressure or heat-pressure can be used without any limitation which can give a sufficient contact without formation of bubble. A pressure roll and a stamper are useful for pressing and a thermal head, a heating roll and a hot stamp are useful for heating-pressing.

The pressure to be applied is preferably from 0.1 kg/cm to 20 kg/cm, more preferably from 0.5 kg/cm to 10 kg/cm, and the transporting speed is preferably from 0.1 mm/sec. to 200 mm/sec., more preferably 0.5 mm/sec. to 100 mm/sec., when the pressure roller is used. When the stamper is used, the pressure is preferably from 0.05 kg/cm$^2$ to 10 kg/cm$^2$, more preferably 0.5 to 5 kg/cm$^2$, and the pressing time is preferably from 0.1 seconds to 50 seconds, more preferably from 0.5 seconds to 20 seconds. When the heating roller is used, the heating temperature is preferably from 60° C. to 200° C., more preferably from 80° C. to 180° C., the pressure is preferably from 0.1 kg/cm to 20 kg/cm, more preferably from 0.5 kg/cm to 10 kg/cm, and the transporting speed is preferably from 0.1 mm/seconds to 200 mm/seconds, more preferably from 0.5 mm/seconds to 100 mm/seconds.

For peeling off the support of the protective layer transferring foil after the pressing or heating-pressing treatment, various methods, such as a method using a peeling plate or a peeling roller in which the peeling angle is fixed, and a me:hod by hand in which the transferring sheet and the image forming element are not fixed, may be used until the method does not influence to the image formation.

In the invention, it is preferred that the dynamic friction coefficient between the surface of the transferring layer and the surface of the colorant layer of the image forming element is within the range of from 0.4 to 1.0. When the dynamic friction is within this range, the transporting ability in the apparatus can be made suitable and the jamming can be prevented.

Image Forming Element

A typical example of the image forming element to which the protective layer transferring foil according to the invention is applied is described below.

The typical image forming element comprises a support and a colorant layer provided on the support, which comprises a binder and a colorant capable of absorbing a light having a wavelength generated from a light source.

As the support, those the same as the support for the protective layer transferring foil are usable. The thickness of the support is preferably from 10 $\mu$m to 500 $\mu$m, more preferably from 15 $\mu$m to 250 $\mu$m.

The colorant may be one capable of absorbing the wavelength of the light generated from the light source. For example, carbon black is preferred since it absorbs a wide range of light from region of UV, visible to infrared light. A dye or pigment which does not absorb the light generated from the light source may be additionally used according to necessity.

Moreover, an inorganic or organic pigment or dye may be used. The pigment or dye may be used singly of in combination of two or more kinds thereof. As the inorganic pigment, the following are useful; titanium dioxide, carbon black, zinc oxide, Prussian blue, cadmium sulfide, iron oxide, a chromate of lead, zinc, barium, or calcium, a metal powder of iron, chromium, manganese, cobalt, nickel, copper, zinc, titanium, silver, aluminum, gold or platinum, and an oxide of the metal containing the metal.

Preferably usable metal-containing powder includes a ferromagnetic iron oxide powder, a ferromagnetic metal powder and a tabular powder or a cubic system crystal. Among them, the ferromagnetic metal powder is preferred.

As the binder resin, one capable of sufficiently suspending the colorant absorbing the light from the light source and the metal-containing powder can be used without any limitation. Typical example of such the binder includes a polyurethane resin, a polyester resin and a vinyl chloride resin such as vinyl chloride copolymer. The binder resin may be used singly or in combination.

A vinyl chloride resin such as a vinyl chloride-vinyl acetate copolymer, a polyolefin resin such as a butadiene-acrylonitrile copolymer, a polyvinyl acetal resin such as a polyvinyl butyral, a cellulose resin such as a nitrocellulose, a styrene resin such as a styrene-butadiene copolymer, an acryl resin such as a polymethyl methacrylate, a polyamide resin, a phenol resin, an epoxy resin and a phenoxy resin may further be used in combination.

The content of the binder in the colorant layer is preferably from 1% to 50%, more preferably from 5% to 40%, by weight of the whole composition of the colorant layer.

In the colorant layer, an additive such as a lubricant, a durability improving agent, a dispersant, an antistatic agent, a filler and a hardener may be added unless the additive does not disturb the effect of the invention. The adding amount of the additive is preferably from 0 to 20%, more preferably from 0 to 15%, by weight.

The thickness of the colorant layer $t_1$ is preferably from 0.05 $\mu$m to 5.0 $\mu$m, more preferably from 0.1 $\mu$m to 3.0 $\mu$m. The colorant layer may be composed of a single layer or plural layers different from each other in the composition thereof.

The colorant layer is formed by coating and drying a coating liquid on the support. The coating liquid is prepared by diluting a concentrated liquid which is prepared by kneading, for example, the ferromagnetic powder and the binder resin and, optionally, the lubricant, durability improving agent, dispersant, antistatic agent, filler and hardener according to necessity. The colorant layer may be coated by a coater such as an extrusion coater. A treatment for orientating the ferromagnetic powder or a calender treatment may be applied according to necessity. It is preferred to orient the magnetic powder for obtaining a high resolution image since the coagulation force in the layer can be easily controlled.

It is preferable embodiment that an overcoat layer is provided on the colorant layer of the image forming element.

The overcoat layer is mainly formed by a binder resin. There is no specific limitation on the binder resin. Example of the resin includes a polyurethane resin, a polyester resin, a vinyl chloride resin such as a vinyl chloride-vinyl acetate copolymer, a polyolefin resin such as a butadiene-acrylonitrile copolymer, a polyvinyl acetal resin such as polyvinyl butyral, a cellulose resin such as a nitro cellulose, a styrene resin such as a styrene-butadiene copolymer, a polyacryl resin such as a polymethyl methacrylate, a polyamide resin, a phenol resin, an epoxy resin, a phenoxy resin, an acetal resin such as a polyvinyl butyral, a polyvinyl acetoacetal, a polyvinyl formal, and a water-soluble resin such as a polyvinyl alcohol and gelatin. The binder resin may be used singly or in combination.

A hardener such as a polyisocyanate is preferably added to raise the durability of the overcoat layer.

In the course of the image formation, the image forming element is imagewise irradiated by thermal energy to generate an ablation at the irradiated portion, and the colorant layer of the irradiated portion is transferred to an image peeling sheet. At this time, the overcoat layer on the irradiated portion of the colorant layer is transferred to the image peeling sheet together with the colorant layer.

When the overcoat layer is provided on the colorant layer, the thickness of the overcoat layer is preferably not more than the thickness of the colorant layer $t_1$. The effect of the invention is enhanced when the thickness of the overcoat layer is a half or less of the thickness of the colorant layer $t_1$.

In the invention, the protective layer transferring foil and the image forming element to be protected should be satisfied the following relation.

$$t_2>2\times t_1$$

In the above, $t_1$ is the thickness of the colorant layer of the image forming element, and $t_2$ is the thickness of the thermally transferable layer for protecting the image formed on the image forming element, which is prepared by coating a coating liquid containing a emulsion of a thermoplastic resin on a support and dried. When the overcoat layer is provided on the colorant layer, the thickness of the overcoat layer is included in the thickness of the colorant layer $t_1$.

When the ratio of $t_2$ to $t_1$ is less than 2, or the thermally transferable layer is not composed of the thermoplastic resin emulsion, the compliance of the layer with the unevenness of the image is insufficient and the sufficient durability after transfer is difficultly obtained.

The thickness of colorant layer $t_1$ is preferably from 0.05 $\mu$m to 5.0 $\mu$m, more preferably from 0.1 $\mu$m to 3.0 $\mu$m. The colorant layer may be composed of single layer or plural layers each different in the composition thereof. The thickness of the thermally transferable layer $t_2$ is preferably within the range of from 0.1 $\mu$m to 20 $\mu$m, more preferably from 0.5 $\mu$m to 10 $\mu$m. When the thickness $t_2$ is within such the range, the effect of the invention is enhanced.

The effect of the invention can be enhanced when the surface of the colorant layer is subjected to a calender treatment.

The calender treatment is performed by passing the colorant layer laminated on the support of the image forming element through the nip between a heated nip roller having a high surface smoothness and a diameter from 1 to 100 cm, and a roller facing the nip roller while applying heat and pressure. The vacancy in the colorant layer formed in the course of the coating and drying process thereof is reduced and the density of the colorant layer is increased.

In the calender treatment, it is preferred to applied a nip pressure of from 5 kg/cm to 500 kg/cm, more preferably 10 kg/cm to 400 kg/cm, for reducing the vacancy ratio of the colorant layer. The heating temperature is preferably from 40° C. to 200° C., more preferably 50° C. to 120° C. However, the optimal heating temperature is varied depending on the transporting speed, the calendering temperature is set so that the maximum temperature of the colorant layer is reached about 30° C. to 100° C.

The calender treatment is preferably performed just after the forming the colorant layer as well as the hardener is added or not. However, the calender treatment may be performed after the overcoat layer is laminated on the colorant layer. The thickness $t_1$ of the colorant layer is that after calender treatment when the colorant layer is subjected to the calendering treatment.

Image Peeling Sheet

In the invention, the image peeling sheet is an element capable of peeling an unnecessary port ion of the colorant layer ablated by the irradiated energy when the image peeling sheet is contacted at the time of imagewise exposure.

In the later-mentioned image forming procedure, the image peeling sheet is used for peeling off the unnecessary portion of the image forming layer imagewise exposed to light is used, which is prepared by a layer of a self supportable resin or by laminating a layer of a thermoplastic resin on a resin film usable as the foregoing support.

When the image peeling sheet is made from a resin having a self-supporting property, the image peeling sheet can be formed on the colorant layer by coating and drying the resin dissolved in a solvent on the colorant layer. When a film having a heat-sealing ability such as a polypropylene film, is used as the image peeling sheet, the image peeling sheet can be formed by laminating the film on the surface of the colorant layer and contacting by a heating-pressing treatment using a heating roller or a hot stamp.

When a film having no heat-sealing ability, the film is contacted to the colorant layer through an adhesive layer laminated on the colorant layer. Example of the procedure to form the image peeling sheet includes the followings;

a composition for forming the adhesive layer is coated on the colorant layer. After drying the adhesive layer, a resin film is laminated on the adhesive layer by heating and pressing using a heating roller or a hot stamp to form an image peeling sheet;

a composition for forming the adhesive layer is coated on a resin film and dried. The surface of the adhesive layer coated on the film is contacted to the colorant layer by heating and pressing using a heating roller or a hot stamp to form an image peeling sheet; and a composition for forming the adhesive layer is molten by heating and laminated by extrusion method on a resin film, and the surface of the adhesive layer is contacted to the colorant layer by heating and pressing using a heating roller or a hot stamp to form an image peeling sheet.

The thickness of the image peeling sheet is preferably from 5 μm to 300 μm, more preferably from 10 μm to 100 μm.

Heat treatment by the heating roller is preferably performed under conditions of a temperature of from a room temperature to about 180° C., more preferably from 30° C. to 160° C., a pressure of from 0.5 kg/cm to 10 kg/cm, and a transporting speed of 5 mm/seconds to 300 mm/seconds. The hardness of the rubber of the roller is preferably from 40 to 90 degree according to JIS-6301A. When the hot stamp is used, the treatment is preferably performed under conditions of a temperature of from a room temperature to 180° C., more preferably from 30° C. to 150° C., a pressure of from 0.5 kg/cm$^2$ to 5 kg/cm$^2$, and a time of from 0.1 seconds to 50 seconds, more preferably from 0.5 seconds to 20 seconds.

Image Forming Procedure

In the image forming procedure of the invention, the foregoing image forming element composed of the support and the colorant layer provided on the support is used. The surface of the colorant layer is contacted with the image peeling sheet, and the element is imagewise exposed to light to ablate the colorant layer. The image peeling sheet is peeled off from the image forming element to remove the ablated portion of the colorant layer to form the image. Thus an image is formed in the colorant layer of the image forming element.

Although any light source capable of causing ablation can be used without any limitation, electromagnetic rays, particularly UV rays, visible rays and infrared rays having a wavelength of from 1 nm to 1 mm, are preferably used since energy of such the rays can be condensed at a small applying area. As the light source capable of applying such the light energy, a laser, a light-emission diode, a xenon flash lamp, a halogen lamp, a carbon arc lamp, a metal halide lamp, a tungsten lamp, a quartz mercury lamp, and a high pressure mercury lamp are preferably usable. The distance from the light source, the exposing time and the intensity of energy can be optionally controlled depending on the kind of the image forming element.

When laser light is used, a laser generating light within the region of visible and near infrared having a wavelength of from 600 nm to 1200 nm is preferably used from the viewpoint of the sensitivity since energy of such the light can be converted to heat with a high efficiency.

After the imagewise exposing, the image peeling sheet is peeled off from the surface of the colorant layer. Thus the ablated portion of the colorant layer is taken off by the image peeling sheet and an image is formed on the image forming element. The image forming element contacted with the image peeling sheet may be subjected to a pressing or heating-pressing treatment after the imagewise exposure. As a result of such the treatment, the ablated portion of the colorant layer can be more effectively removed and the quality of the image remained on the image forming element can be further improved.

For peeing off the support of the protective layer transferring foil after the pressing or heating-pressing treatment, various method may be used such as a method using a peeling plate or a peeling roller in which the peeling angle is fixed, and a method by hand in which the transferring sheet and the image forming element are not fixed, until the method does not influence to the image formation.

EXAMPLES

In the followings, the terms of "parts" means "parts by weight of the effective component".

Example 1

Preparation of Image Forming Element

An image forming element contacted with an image peeling sheet E-1 was prepared by using an image forming medium composed of the following support, colorant layer and over-coating layer, and an image peeling sheet.

Image Forming Element

Support

A transparent polyethylene terephthalate (PET) film having a thickness of 100 μm, T-60 manufactured by Torey Co., Ltd., one side of which had been treated by corona discharge. Colorant layer The following composition was kneaded and dispersed by an open kneader to prepared a colorant layer coating liquid containing a magnetic metal powder. The coating liquid was coated on the foregoing support and subjected to a magnetic orientation treatment during the coated layer was wetted. Then the coated layer was dried and calendered. Thereafter, the coated matter was treated by heat at 60° C. for 24 hours. Thus a colorant layer having a thickness of 0.8 μm was formed.

| Colorant layer coating liquid | |
|---|---|
| Fe-Al type ferromagnetic metal powder as a colorant and metal-containing powder (atomic ratio of Fe:Al is 100:4 in the whole, 50:50 at the surface, average length of major axis is 0.14 μm) | 100 parts |
| Vinyl chloride resin containing a potassium sulfonate group MR-110 (Nihon Zeon Co., Ltd.) | 10 parts |
| Polyurethane resin containing a sodium sulfonate group UR-8700 (Toyo Boseki Co., Ltd.) | 10 parts |
| α-alumina (average diameter: 0.15 μm) | 8 parts |
| Stearic acid | 1 part |
| Butyl stearate | 1 part |
| Polyisocyanate Coronate L (Hihon Polyurethane Kogyo Co., Ltd.) | 55 parts |
| Cyclohexanone | 100 parts |
| Methyl ethyl ketone | 100 parts |
| Toluene | 100 parts |

Overcoat Layer

An overcoat layer coating liquid having the following composition was prepared. The coating liquid was coated on the surface of the above-mentioned colorant layer by a wire bar so that the coated amount of the coating liquid was to be 10 g/m$^2$, and dried. Thus an overcoat layer having a coated amount of 0.1 g/m$^2$ was formed.

| Overcoat layer coating liquid | |
|---|---|
| Phenoxy resin PKHH (Phenoxy Associate Co., Ltd.) | 1 part |
| Cyclohexanone | 250 parts |
| Toluene | 749 parts |

Image Peeling Sheet

Support

A transparent PET film having a thickness of 24 μm, T-100E manufactured by Diafoil-Hoechst Co., Ltd., was used, one side of which had been treated for improving the adhesiveness. Adhesive layer A adhesive layer coating liquid having the following composition was prepared and coated by a wire bar on the treated surface of the foregoing support and dried so that the coated amount after dried was to be 1.5/m$^2$. Thus an image peeling sheet was prepared.

| Adhesive layer coating liquid | |
|---|---|
| Polyurethane resin Nipporan 3116, solid content 21% (Nihon Polyurethane Co., Ltd.) | 115 parts |
| Silicone fine particle Tospar 120 (Toshiba Silicone Co., Ltd.) | 1 part |
| Cyclohexanone | 24 parts |
| Toluene | 36 parts |
| Methyl ethyl ketone | 30 parts |

The image forming element and the image peeling sheet were face and contacted by a heating-pressure treatment using a heating roller so that the adhesive force was to be within the range of from 5 to 15 gf/cm measured by a 180° peeling method according to JIS C 2107 (JIS Z 0237).

Image Formation

The image forming element was exposed by a light beam generated from a semiconductor laser TCP-1080, manufactured by Dainihon Screen Seizo Co., Ltd., having a principal wavelength of 830 nm and energy of 320 mJ/cm$^2$ from the side of the support of the colorant layer so that a line and space image having a width of 3 dots was formed. The laser beam was focused at the surface of the colorant layer. Then the unnecessary exposed portion the colorant layer is transferred to the image peeling sheet to form the image.

Preparation of Protective Layer Transferring Foil

Support

A matted PET film E-180 having a thickness of 26 $\mu$m, manufactured by Diafoil-Hoechst Co., Ltd., was used as a support.

The following thermally transferable layer coating liquid was coated on the foregoing support by a wire bar so that the dry thickness of the layer was to be those shown in Table 1, and dried. Samples 1 through 11 were prepared in which the thickness of the layer were different from each other as shown in Table 1.

| Thermally transferable layer coating liquid | |
|---|---|
| Polyester resin emulsion, Pesresin A-515G, solid content: 30% (Takamatsu Yushi Co., Ltd.) | 293 parts |
| Polyethylene resin emulsion, Hytec E-1000, solid content: 35% (Toho Kagaku Co., Ltd.) | 30 parts |

Transfer of the Protective Layer

The colorant layer surface of the image forming element E-1 on which an image had been formed was face to the thermally transferable layer surface of the protective layer transferring foil were faced to each other and subjected to a heat-pressing treatment by a transferring device having a metal roll with a diameter of 140 mm which was covered with a heat proof silicone rubber having a thickness of 1 mm and a rubber hardness of 60, and a counter metal roller having a diameter of 140 mm, under conditions of a line pressure of 6 kg/cm, a temperature of the heating roller of 170° C. and a transporting speed of 2.5 cm/seconds. Then the support of the protective layer transferring foil was peeled off. Thus a protective layer formed by the thermally transferable layer was provided on the image forming element.

Each of the samples were evaluated by the following methods.

Glossiness

The glossiness of the image surface was measured according to ASTMD2457-97. Both of the incident angle and the reflection angle were 60°.

Scratch Resistivity

The sample was fixed on a horizontal flat table. A sand paper #1500 was put on the sample and moved in the horizontal direction at a speed of 10 cm/seconds while applying a load of 20 g/cm$^2$. Then scratched formed on the image surface were observed and classified the following four ranks.

A: No transparent scratch was observed.

B: Transparent scratches in a shape of pinhole were observed.

C: Two or three transparent scratch lines were observed.

D: Many transparent scratch lines were observed.

Adhesiveness of the Protective Layer

A cellophane tape, Cellotape No. 409 manufactured by Nichiban Co., Ltd., was adhered on the surface of the image at which the transferring layer had been transferred. Then the tape was peeled off at an angle of 180° and a speed of 30 cm/seconds. Then the status of situation of the surface of the image was visually observed and classified to the following four ranks.

A: No variation was observed.

B: The glossiness of the surface was varied a little but the peel of the protective layer was not observed.

C: The protective layer was peeled at the exposed portion where the colorant layer did not exist.

D: The protective layer was peeled at a half or more of the transferred area.

Situation of the Image Surface

The situation of the surface of the image on which the transferring layer was transferred was visually observed and classified according to the following four ranks.

A: Good uniformity of the surface was observed.

B: Small bubbles were observed only when the surface was observed through a magnifying glass.

C: Bubbles were observed by visual observation.

D: Bubbles and wrinkles were observed.

Thus evaluated results are shown in Table 1

Preparation of Sample 11

Sample 11 was prepared in the same manner as in Sample 6, except that the composition of thermally transferable layer coating liquid was changed as follows. The dry thickness of the layer was 3.0 $\mu$m.

Support

A matted PET film the same as that used in Samples 1 to 10 was sued.

| Thermally transferable layer coating liquid | |
|---|---|
| Polyester resin Vylon 200 (Toyobo Co., Ltd.) | 48.5 parts |
| Polyethylene wax dispersion T-15P-2 (Gifu Celac Seizosyo Co., Ltd.) | 10 parts |
| Toluene | 120 parts |
| Methyl ethyl ketone | 71.5 parts |

Preparation of Sample 12

Sample 12 was prepared in the same manner as in Sample 11 except that the composition of the thermally transferable layer of the protective layer transferring foil was changed as follows.

Thermally Transferable Layer Coating Liquid

Urethane resin emulsion NeoRez R-960, solid content: 33% (Zeneca Co., Ltd.) 226 parts Polyethylene resin emulsion, Hitec E-1000 30 parts Preparation of Samples 13 Through 16

Samples 13 through 16 were prepared in the same manner as in Sample 12 except that the layer thickness was changed to 4.0 μm and the following supports of the foil were used in each of the samples. These support were different in the surface glossiness from each other.

Sample 13: PET film E-130, manufactured by Diafoil-Hoechst Co., Ltd., having a thickness of 26 μm and a surface glossiness of 28.

Sample 14: PET film E-150, manufactured by Diafoil-Hoechst Co., Ltd., having a thickness of 26 μm and a surface glossiness of 41.

Sample 15: PET film T-100, manufactured by Diafoil-Hoechst Co., Ltd., having a thickness of 25 μm and a surface glossiness of 151.

Sample 16: PET film T-600E, manufactured by Diafoil-Hoechst Co., Ltd., having a thickness of 23 μm and a surface glossiness of 171.

Preparation of Samples 17 Through 24

Samples 17 through 24 were prepared in the same manner as in Sample 7 except that the thermally transferable layer coating liquid of the protective layer transferring foil was changed as follows and PET film T-100, manufactured by

| Thermally transferable layer coating liquid | |
|---|---|
| Polyester resin emulsion, Pesresin A-515 | 293 parts |
| Polyethylene resin emulsion, Hitec E-1000 | 30 parts |
| Silica fine particle (fore-mentioned) | Necessary amount to adjust the glossiness |

Preparation of Sample 25

Sample 25 was prepared in the same manner as in Sample 5 except that polyethylene resin Hitec E-100 was eliminated from the composition of the thermally transferable layer of the protective layer transferring foil, which was added as a lubricant.

Samples 11 through 25 were evaluated in the same procedure as to Samples 1 to 10. Thus obtained results are shown in Table 1.

TABLE 1

| Sample No | Support | Transferring layer Resin | Transferring layer Coating liquid | Lubricant | Thickness $t_2$ (μm) | Glossiness Support | Glossiness Foil surface | Scratch resistivity | Adhesiveness | Surface situation |
|---|---|---|---|---|---|---|---|---|---|---|
| Sample No | Support | Adhesive layer | Coating liquid | Lubricant | Thickness $t_2$ (μm) | Glossiness Support | Glossiness Foil surface | Scratch resistivity | Adhesiveness | Surface situation |
| 1 (c) | E-180 | PES | aqEm | Presence | 0.8 | 81 | — | D | B | C |
| 2 (c) | E-180 | PES | aqEm | Presence | 1.2 | 81 | — | C | B | C |
| 3 (c) | E-180 | PES | aqEm | Presence | 1.6 | 81 | — | C | B | C |
| 4 (i) | E-180 | PES | aqEm | Presence | 2.0 | 81 | — | B | A | A |
| 5 (i) | E-180 | PES | aqEm | Presence | 2.5 | 81 | — | A | A | A |
| 6 (i) | E-180 | PES | aqEm | Presence | 3.0 | 81 | — | A | A | A |
| 7 (i) | E-180 | PES | aqEm | Presence | 4.0 | 81 | — | A | A | A |
| 8 (i) | E-180 | PES | aqEm | Presence | 6.0 | 81 | — | A | A | A |
| 9 (i) | E-180 | PES | aqEm | Presence | 8.0 | 81 | — | A | A | A |
| 10 (i) | E-180 | PES | aqEm | Presence | 10.0 | 81 | — | A | B | B |
| 11 (c) | E-180 | PES | Sol | Presence | 3.0 | 81 | — | C | C | D |
| 12 (i) | E-180 | PUR | aqEm | Presence | 3.0 | 81 | — | B | B | B |
| 13 (i) | E-130 | PUR | aqEm | Presence | 4.0 | 28 | — | B | B | B |
| 14 (i) | E-150 | PUR | aqEm | Presence | 4.0 | 41 | — | A | A | A |
| 15 (i) | T-100 | PUR | aqEm | Presence | 4.0 | 151 | — | B | B | B |
| 16 (i) | T-600E | PUR | aqEm | Presence | 4.0 | 171 | — | B | B | B |
| 17 (i) | T-100 | PES | aqEm | Presence | 4.0 | — | 30 | B | B | B |
| 18 (i) | T-100 | PES | aqEm | Presence | 4.0 | — | 39 | B | B | A |
| 19 (i) | T-100 | PES | aqEm | Presence | 4.0 | — | 42 | A | A | A |
| 20 (i) | T-100 | PES | aqEm | Presence | 4.0 | — | 65 | A | A | A |
| 21 (i) | T-100 | PES | aqEm | Presence | 4.0 | — | 78 | A | A | A |
| 22 (i) | T-100 | PES | aqEm | Presence | 4.0 | — | 90 | A | A | A |
| 23 (i) | T-100 | PES | aqEm | Presence | 4.0 | — | 95 | A | B | B |
| 24 (i) | T-100 | PES | aqEm | Presence | 4.0 | — | 113 | B | B | B |
| 25 (i) | E-180 | PES | aqEm | None | 2.5 | 81 | — | B | B | B |

(i) : Inventive example
(c): Comparative example
Transferring layer: Heat-sensitive transferring layer of the transferring foil
PES: Polyester resin
PUR: Polyurethane resin
aqEm: Aqueous emulsion
Sol: Solution
Thickness $t_2$: Thickness of of the heat-sensitive transferring layer of the transferring foil Diafoil-Hoechst Co., Ltd., having a thickness of 25 μm was used as the support. In the coating liquid a silica fine particle, Silysia 320 manufactured by Fuji Silysia Co., Ltd., was added so that the surface glossiness of the protective layer transferring foil was to be those shown in table 1.

In all the samples, the thickness of the colorant layer $t_1$ was 0.8 μm. Accordingly Samples 1 and 2 do not satisfied the relation of $t_1 > 2 \times t_2$. In the sample 11, the thermally transferable layer of the protective layer transferring foil is formed by the coating solution composed of the resin solution.

As is shown in Table 1, the samples according to the invention, other than Samples 1, 2 and 11, are excellent in the scratch resistivity, adhesiveness and the surface situation.

Example 2

Preparation of Samples 26 Through 32

Image forming elements E-2 through E-8 were prepared in the same manner as in E-1 in Example 1 except that the thickness of the colorant layer was changed as shown in Table 2. Samples 26 through 32 were prepared by combining each the image forming element E-2 to E-8 with the protective layer transferring foil of Sample 4.

These samples were evaluated in the same procedure as in Example 1. Thus obtained results are shown in table 2.

-continued

| | |
|---|---|
| Polyethylene resin emulsion Hitec E-1000, solid content: 35% (Toho Kagaku Co., Ltd.) | 30 Parts |
| Thermally transferable layer coating liquid B-3 | |
| Polyester resin emulsion Pesresin A-124S, solid content: 23%, Tg: 55° C. (Takamatsu Yushi Co., Ltd.) | 382 parts |
| Polyethylene resin emulsion E-1000, solid content: 35% (Toho Kagaku Co., Ltd.) | 30 Parts |
| Thermally transferable layer coating liquid B-4a | |
| Polyester resin emulsion Pesresin A-515G, solid content: 30%, Tg: 62° C. | 293 parts |

TABLE 2

| Sample No. | Image forming element | Thickness ($\mu$m) Colorant layer $t_1$ | Transferring layer $t_2$ | $t_2/t_1$ | Glossiness of support | Scratch resistivity | Adhesiveness | Surface situation |
|---|---|---|---|---|---|---|---|---|
| 26 (i) | E-2 | 0.5 | 2.0 | 4.0 | 81 | A | A | A |
| 27 (i) | E-3 | 0.7 | 2.0 | 2.9 | 81 | A | A | A |
| 28 (i) | E-4 | 0.9 | 2.0 | 2.2 | 81 | B | A | A |
| 29 (c) | E-5 | 1.2 | 2.0 | 1.7 | 81 | C | C | C |
| 30 (c) | E-6 | 1.5 | 2.0 | 1.3 | 81 | D | C | C |
| 31 (c) | E-7 | 2.0 | 2.0 | 1.0 | 81 | D | C | C |
| 32 (c) | E-8 | 2.5 | 2.0 | 0.8 | 81 | D | C | C |

(i): Inventive example
(c): Comparative example

Samples in which the thickness of the thermally transferable layer of the protective layer transferring foil $t_2$ and the thickness of the colorant layer of the image forming element $t_1$ satisfy the relation of $t_2>2\times t_1$ are excellent in the each of the evaluated properties.

Example 3

Image Forming Element

Image forming element E-1 prepared in Example 1 was used.

Image formation

An image was formed on the image forming element in the same manner as in Example 1.

Preparation of Protective Layer Transferring Foil

Support

The surface matted PET film E-180 used in Example 1 was used.

Nine kind of protective layer transferring foil were prepared by coating the following thermally transferable layer coating liquids. The coating liquid was coated on the support by a wire bar and dried so that the dry thickness was to be 4 $\mu$m.

| | |
|---|---|
| Thermally transferable layer coating liquid B-1 | |
| Polyester resin emulsion Pesresin A-110, solid content: 15%, Tg: 20° C. (Takamatsu Yushi Co., Ltd.) | 586 parts |
| Polyethylene resin emulsion Hitec E-1000, solid content: 35% (Toho Kagaku Co., Ltd.) | 30 Parts |
| Thermally transferable layer coating liquid B-2 | |
| Polyester resin emulsion Pesresin A-510, solid content: 25%, Tg: 35° C. (Takamatsu Yushi Co., Ltd.) | 325 parts |

-continued

| | |
|---|---|
| (Takamatsu Yushi Co., Ltd.) | |
| Polyethylene resin emulsion Hitec E-1000, solid content: 35% (Toho Kagaku Co., Ltd.) | 30 Parts |
| Thermally transferable layer coating liquid B-4b | |
| Polyester resin emulsion Pesresin A-515G, solid content: 30%, Tg: 62° C. (Takamatsu Yushi Co., Ltd.) | 293 parts |
| Polyester resin emulsion Pesresin A-193G, solid content: 30%, Tg: −20° C. (Takamatsu Yushi Co., Ltd.) | 133 parts |
| Polyethylene resin emulsion Hitec E-1000, solid content: 35% (Toho Kagaku Co., Ltd.) | 30 parts |
| Polyethylene wax aqueous dispersion A-212, solid content: 40% (Gifu Celac Co., Ltd.) | 215 parts |
| Thermally transferable layer coating liquid B-4c | |
| Polyester resin emulsion Pesresin A-515G, solid content: 30%, Tg: 62° C. (Takamatsu Yushi Co., Ltd.) | 293 parts |
| Polyester resin emulsion Pesresin A-193G, solid content: 30%, Tg: −20° C. (Takamatsu Yushi Co., Ltd.) | 200 parts |
| Polyethylene resin emulsion Hitec E-1000, solid content: 35%(Toho Kagaku Co., Ltd.) | 30 parts |
| Polyethylene wax aqueous dispersion A-212, solid content: 40% (Gifu Celac Co., Ltd.) | 92 parts |
| Thermally transferable layer coating liquid B-5 | |
| Polyester resin emulsion Pesresin A-615G, solid content: 25%, Tg: 65° C. (Takamatsu Yushi Co., Ltd.) | 352 parts |
| Polyethylene resin emulsion Hitec E-1000, solid content: 35% (Toho Kagaku Co., Ltd.) | 30 Parts |
| Thermally transferable layer coating liquid B-6 | |
| Polyester resin emulsion Pesresin A-193G, solid content: 30%, Tg: −20° C. (Takamatsu Yushi Co., Ltd.) | 293 parts |

-continued

| | |
|---|---|
| Polyethylene resin emulsion Hitec E-1000, solid content: 35% (Toho Kagaku Co., Ltd.) | 30 Parts |
| Thermally transferable layer coating liquid B-7 | |
| Polyester resin emulsion Pesresin A-123D, solid content: 20%, Tg: 75° C. (Takamatsu Yushi Co., Ltd.) | 440 parts |
| Polyethylene resin emulsion Hitec E-1000, solid content: 35% (Toho Kagaku Co., Ltd.) | 30 Parts |

In the above compositions, Hitec E-1000 is a polystyrene wax emulsion which has a melting point of 135° C. and has no clear glass transition point.

Transfer of the Thermally Transferable Layer

A protective layer was transferred in a image formed on the image forming element using the foregoing protective layer transferring foil in the same procedure as in Example 1.

Thus obtained samples were evaluated by the following method.

Friction Coefficient

Tribogear Heidon Type 14DR, manufactured by Shinto Kagaku Co., Ltd., was used to measure the friction coefficient. The protective layer transferring foil was put on the image forming element and moved at a speed of 10 mm/seconds while applying a load of 100 g. The contact area of the protective layer transferring foil and the image forming element was 9.0 $cm^2$.

Jamming in Apparatus

The transporting ability was evaluated by using a laser imager Herios Li-1417D, manufactured by Konica Corporation. Fifty sheets of each of the samples were continuously run in the apparatus. The sample, 50 sheets of which were passed through the apparatus without jamming, was ranked as A, and the sample, one ore more sheets were jammed in the course of the running of 50 sheets thereof, was ranked as B.

Adhesiveness

The samples were evaluated in the same manner as in Example 1.

Situation of the Surface

The samples were evaluated in the same manner as in Example 1.

The sample ranked A or B in the adhesiveness and the surface situation is acceptable for practical use.

Results of tests in which the same protective layer transferring foil was used and the calendering condition was changed are shown in Table 3, and that of tests in which different protective layer transferring foils was used under the same calendering condition are shown in Table 4.

TABLE 3

| Experiment No. | Colorant layer: Composition | Colorant layer: Calendaring condition (kg/cm) | Colorant layer: Thickness (μm) | Thermally transferable layer | Dynamic friction coefficient μ | Jamming | Adhesiveness |
|---|---|---|---|---|---|---|---|
| 33 | E-1 | 50 | 0.91 | B-4a | 0.4 | A | A |
| 34 | E-1 | 100 | 0.85 | B-4a | 0.5 | A | A |
| 35 | E-1 | 300 | 0.80 | B-4a | 0.6 | A | A |
| 36 | E-1 | 400 | 0.79 | B-4a | 0.9 | A | A |
| 37 | E-1 | 0 | 1.05 | B-4a | 0.3 | B | B |

TABLE 3-continued

| Experiment No. | Colorant layer: Composition | Colorant layer: Calendaring condition (kg/cm) | Colorant layer: Thickness (μm) | Thermally transferable layer | Dynamic friction coefficient μ | Jamming | Adhesiveness |
|---|---|---|---|---|---|---|---|
| 38 | E-1 | 500 | 0.78 | B-4a | 1.2 | B | A |

The protective layer transferring foils having a dynamic friction coefficient with in the range of from 0.4 to 1.0 are excellent in the jamming in apparatus, adhesiveness am the surface situation.

TABLE 4

| Experiment No. | Colorant layer: Composition | Colorant layer: Calendering condition (Kg/cm) | Thermally transferable layer: Composition | Thermally transferable layer: Content of resin having a Tg of from 20° C. to 70° C. % | Dynamic friction coefficient (μ) | Jamming | Adhesiveness |
|---|---|---|---|---|---|---|---|
| 39 | E-1 | 300 | B-1 | 90 | 1.0 | A | A |
| 40 | E-1 | 300 | B-2 | 90 | 0.8 | A | A |
| 41 | E-1 | 300 | B-3 | 90 | 0.6 | A | A |
| 42 | E-1 | 300 | B-4a | 90 | 0.6 | A | A |
| 43 | E-1 | 300 | B-5 | 90 | 0.5 | A | A |
| 45 | E-1 | 300 | B-4b | 55 | 0.4 | A | A |
| 46 | E-1 | 300 | B-6 | 90 | 1.3 | B | A |
| 47 | E-1 | 300 | B-7 | 90 | 0.3 | B | B |
| 48 | E-1 | 300 | B-4c | 45 | 0.2 | B | B |

The protective layer transferring foils containing the binder having a Tg of from 20° C. to 70° C. and the content of a binder content in the solid composition is not more than 50% are excellent in the jamming in apparatus, adhesiveness am the surface situation.

What is claimed is:

1. A method for forming an image having a protective layer thereon employing an image forming element comprising a first support having thereon a colorant layer with a thickness of $t_1$, the colorant layer comprising a colorant and a binder; and a protective layer transferring foil comprising a second support having thereon a thermally transferable layer, the thermally transferable layer having a thickness of $t_2$ and being formed by coating the second support with a coating liquid and thereafter drying the coating liquid, the coating liquid comprising a thermoplastic resin emulsion dispersed in a dispersing medium;

wherein the method comprises steps of forming an image in the colorant layer by imagewise exposing the colorant layer to light, and providing a protective layer on the colorant layer having the image by transferring a thermally transferable layer from a protective layer transferring foil by means of heating the protective layer transferring foil, wherein the $t_1$ and $t_2$ satisfy a relation of $t_2>2\times t_1$.

2. The method of claim 1, herein the thermoplastic resin is a polyester resin.

3. The method of claim 1, wherein the glossiness of the surface of the thermally transferable layer of the transferring foil is from 40 to 90 at an angle of 60°.

4. The method of claim 1, wherein the glossiness of the surface of the transferring foil on which the thermally transferable layer to be coated is from 40 to 90 at an angle of 60°.

5. The method of claim 1, wherein the thermally transferable layer contains a lubricant.

6. The method of claim 1, wherein the thermally transferable layer contains fine particles.

7. The method of claim 1, wherein the dynamic friction coefficient between the surface of the layer comprising a binder and a colorant and the surface of the thermally transferable layer is from 0.4 to 1.0.

8. The method of claim 1, wherein the thermoplastic resin has a glass transition point of from 20° to 70° C.

9. The method of claim 1, wherein the image is formed by ablation.

10. The method of claim 1, wherein the thickness $t_1$ of the layer composed of the binder and the colorant is from 0.05 μm to 5.0 μm.

11. The method of claim 1, wherein the thickness $t_2$ of the thermally transferable layer is from 0.1 μm to 20 μm.

* * * * *